US012626891B2

(12) United States Patent
Tamaki et al.

(10) Patent No.: US 12,626,891 B2
(45) Date of Patent: May 12, 2026

(54) PLASMA PROCESSING APPARATUS

(71) Applicant: DAIHEN CORPORATION, Osaka (JP)

(72) Inventors: Ryoji Tamaki, Osaka (JP); Hayato Notomi, Osaka (JP); Shigeki Amadatsu, Osaka (JP); Shinichi Hasegawa, Osaka (JP)

(73) Assignee: DAIHEN CORPORATION, Osaka (JP)

( * ) Notice: Subject to any disclaimer, the term of this patent is extended or adjusted under 35 U.S.C. 154(b) by 75 days.

(21) Appl. No.: 18/741,954

(22) Filed: Jun. 13, 2024

(65) Prior Publication Data

US 2024/0429029 A1      Dec. 26, 2024

(30) Foreign Application Priority Data

Jun. 20, 2023      (JP) ................................. 2023-100803

(51) Int. Cl.
H01J 37/32      (2006.01)

(52) U.S. Cl.
CPC .... H01J 37/32568 (2013.01); H01J 37/3244 (2013.01)

(58) Field of Classification Search
None
See application file for complete search history.

(56) References Cited

U.S. PATENT DOCUMENTS

| | | | | |
|---|---|---|---|---|
| 5,726,415 | A | * 3/1998 | Luo .......................... | H05H 1/28 |
| | | | | 219/121.48 |
| 11,968,769 | B1 | 4/2024 | Qiu et al. | |
| 2008/0283153 | A1 | 11/2008 | Zurecki et al. | |
| 2018/0359842 | A1* | 12/2018 | Buske ...................... | H05H 1/34 |
| 2019/0394867 | A1* | 12/2019 | Asad ....................... | H05H 1/34 |

FOREIGN PATENT DOCUMENTS

| | | |
|---|---|---|
| CN | 116078127 A | 5/2023 |
| DE | 10 2013 017 109 A1 | 4/2015 |
| EP | 2 209 354 A2 | 7/2010 |
| JP | H06-54471 U | 7/1994 |
| JP | 2003-300029 A | 10/2003 |
| JP | 2005-56647 A | 3/2005 |
| WO | 2010/053387 A1 | 5/2010 |

OTHER PUBLICATIONS

Extended European Search Report dated Nov. 18, 2024, issued in European Application No. 24182491.1.

* cited by examiner

*Primary Examiner* — Kenneth B Wells
(74) *Attorney, Agent, or Firm* — Sughrue Mion, PLLC

(57)      ABSTRACT

A plasma processing apparatus includes: an inner electrode; an electrode holder; an outer electrode; an insulating member that surrounds the inner electrode and the electrode holder; a fin member for forming a swirling flow around the inner electrode by causing a process gas supplied to an inner side of the insulating member to swirl; and a nozzle that blows the swirling flow converted into a plasma state. The insulating member is directly or indirectly secured to the outer electrode, and the fin member is secured to the electrode holder while being spaced from the inner electrode, and is in contact with an inner circumferential surface of the insulating member.

6 Claims, 3 Drawing Sheets

PLASMA PROCESSING APPARATUS

CROSS REFERENCE TO RELATED APPLICATIONS

This nonprovisional application is based on Japanese Patent Application No. 2023-100803 filed on Jun. 20, 2023 with the Japan Patent Office, the entire contents of which are hereby incorporated by reference.

BACKGROUND OF THE INVENTION

Field of the Invention

The present disclosure relates to a plasma processing apparatus.

Description of the Background Art

A plasma torch capable of causing a process gas to swirl is known, as is found in Japanese Utility Model Laying-Open No. 6-54471, for example.

SUMMARY OF THE INVENTION

In the plasma processing apparatus described in Japanese Utility Model Laying-Open No. 6-54471, a fin member is in contact with an electrode and a nozzle. Therefore, the fin member may suffer damage due to heat from the electrode and the nozzle.

An object of the present disclosure is to provide a plasma processing apparatus capable of reducing damage to a fin member.

A plasma processing apparatus according to one aspect of the present disclosure includes: an inner electrode that receives application of a voltage; an electrode holder that holds the inner electrode; an outer electrode formed in a tubular shape, the outer electrode surrounding the inner electrode and the electrode holder; an insulating member arranged between the inner electrode and the outer electrode and between the electrode holder and the outer electrode, the insulating member surrounding the inner electrode and the electrode holder; a fin member for forming a swirling flow around the inner electrode by causing a process gas supplied to an inner side of the insulating member to swirl; and a nozzle that blows the swirling flow converted into a plasma state, wherein the insulating member is directly or indirectly secured to the outer electrode, and the fin member is secured to the electrode holder while being spaced from the inner electrode, and is in contact with an inner circumferential surface of the insulating member.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
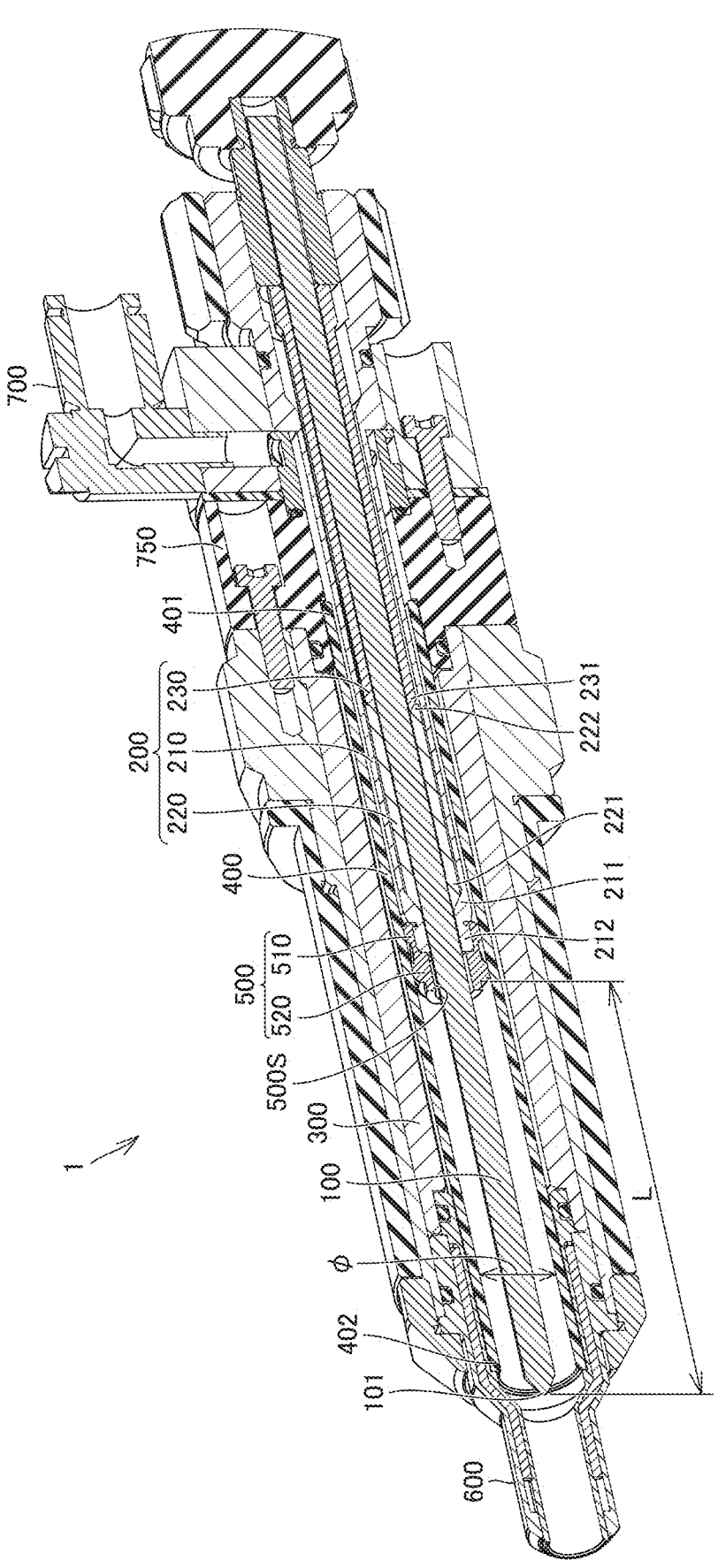
FIG. 1 is a cross-sectional perspective view of a plasma processing apparatus in one embodiment of the present disclosure.

Embodiments of the present disclosure will be described with reference to the drawings. In the drawings referenced below, the same or corresponding members are denoted by the same numerals.

FIG. 1 is a cross-sectional perspective view of a plasma processing apparatus in one embodiment of the present disclosure. This plasma processing apparatus 1 is suitably used for surface modification of a workpiece.

As shown in FIG. 1, plasma processing apparatus 1 includes an inner electrode 100, an electrode holder 200, an outer electrode 300, an insulating member 400, a fin member 500, a nozzle 600, a gas supply unit 700, and an intermediate member 750.

Inner electrode 100 has a linearly extending shape. Inner electrode 100 is made of tungsten, for example. A voltage is applied to inner electrode 100 from a power supply which is not shown.

Electrode holder 200 holds inner electrode 100. Electrode holder 200 is made of copper, for example. Electrode holder 200 will be detailed later herein.

Outer electrode 300 is formed in a tubular shape. More specifically, outer electrode 300 is formed in a cylindrical shape. Outer electrode 300 surrounds inner electrode 100 and electrode holder 200.

Insulating member 400 is arranged between inner electrode 100 and outer electrode 300 and between electrode holder 200 and outer electrode 300. Insulating member 400 surrounds inner electrode 100 and electrode holder 200. Insulating member 400 is formed in a cylindrical shape. Insulating member 400 defines a position where plasma is generated between inner electrode 100 and outer electrode 300. As shown in FIG. 1, the position of a tip end of insulating member 400 is set to expose a tip end 101 of inner electrode 100 from this tip end. In other words, a process gas is converted into a plasma state in the vicinity of tip end 101 of inner electrode 100 due to a discharge phenomenon that occurs between the vicinity of tip end 101 and outer electrode 300.

Figure 2:
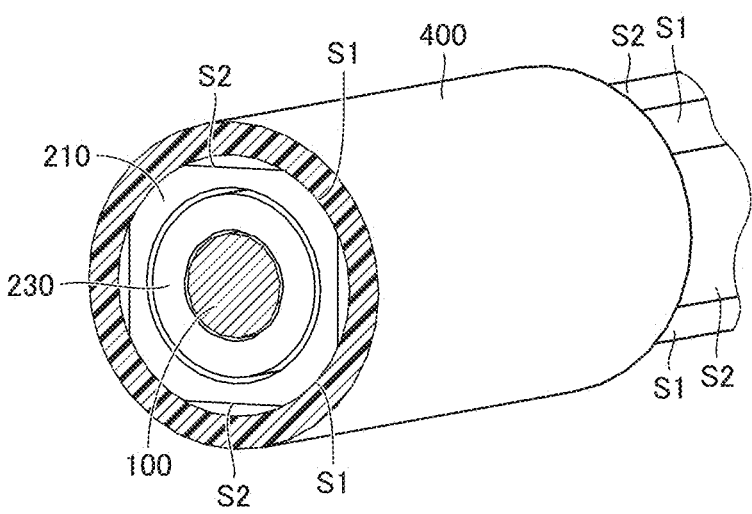
FIG. 2 is a cross-sectional view showing a relationship among an inner electrode, an electrode holder and an insulating member.
Figure 3:
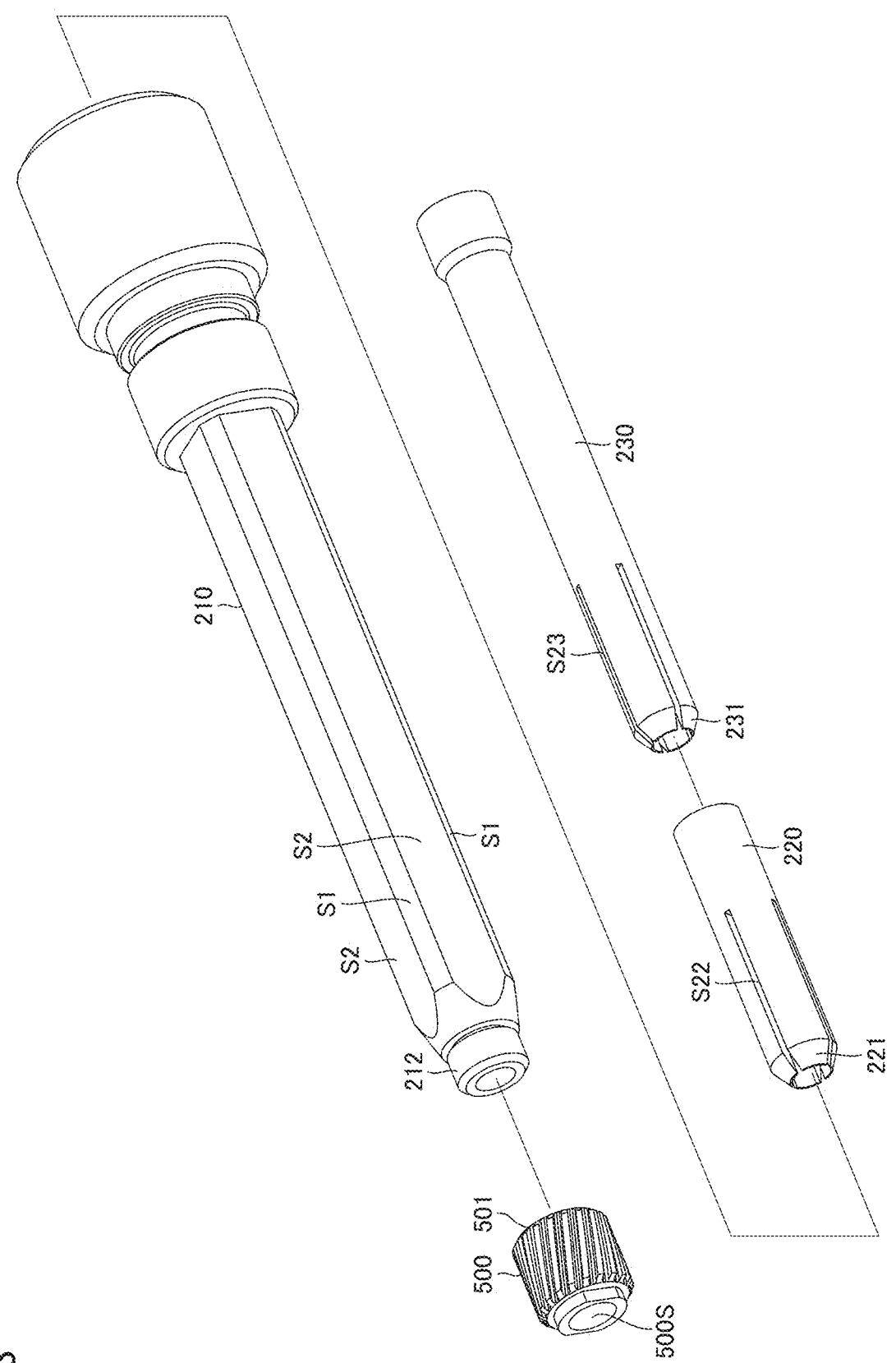
FIG. 3 is an exploded perspective view of the electrode holder and a fin member.

Electrode holder 200 is now detailed. As shown in FIGS. 1 to 3, electrode holder 200 has an outer holder 210, a first inner holder 220, and a second inner holder 230.

Outer holder 210 surrounds inner electrode 100. As shown in FIG. 1, an inner circumferential surface of outer holder 210 is provided with a reduced-diameter portion 211 that is gradually reduced in diameter toward a tip end (downstream side in a flow direction of the process gas). As shown in FIG. 2, an outer circumferential surface of outer holder 210 has a contact surface S1 in contact with an inner circumferential surface of insulating member 400, and a flow path forming surface S2 spaced from the inner circumferential surface of insulating member 400. Flow path forming surface S2 forms a flow path of the process gas together with the inner circumferential surface of insulating member 400. As shown in FIG. 3, flow path forming surface S2 is formed to be flat.

As shown in FIGS. 1 and 3, outer holder 210 has a holding portion 212 that holds fin member 500. Holding portion 212 is formed downstream of flow path forming surface S2 in the flow direction of the process gas.

First inner holder 220 is arranged on the inner side of outer holder 210. First inner holder 220 surrounds inner electrode 100. As shown in FIG. 3, a tip end portion of first inner holder 220 is provided with a slit S22 extending in a direction parallel to an axial direction of first inner holder 220. Therefore, when first inner holder 220 is inserted into outer holder 210, a tip end 221 of first inner holder 220 is pressed against reduced-diameter portion 211 of outer holder 210, and is thereby pressed to contact inner electrode 100. As shown in FIG. 1, an inner circumferential surface of a base end portion of first inner holder 220 is provided with a reduced-diameter portion 222 that is gradually reduced in diameter toward the tip end.

Second inner holder 230 is arranged on the inner side of outer holder 210. Second inner holder 230 surrounds inner electrode 100. As shown in FIG. 3, a tip end portion of second inner holder 230 is provided with a slit S23 extending in a direction parallel to an axial direction of second inner holder 230. Therefore, when second inner holder 230 is inserted into outer holder 210, a tip end 231 of second inner holder 230 is pressed against reduced-diameter portion 222 of first inner holder 220, and is thereby pressed to contact inner electrode 100.

Fin member 500 is a member for forming a swirling flow around inner electrode 100 by causing the process gas (such as argon or air) supplied to the inner side of insulating member 400 to swirl. As shown in FIG. 3, an outer circumferential surface of fin member 500 is provided with a plurality of grooves 501. Fin member 500 is held on holding portion 212 of electrode holder 200. As shown in FIG. 1, the outer circumferential surface of fin member 500 is in contact with the inner circumferential surface of insulating member 400. Therefore, a position of holding portion 212 relative to insulating member 400 is effectively determined through fin member 500. That is, a central axis of inner electrode 100 coincides with a central axis of insulating member 400 by fin member 500, outer holder 210 and first inner holder 220.

As shown in FIG. 1, fin member 500 is spaced from inner electrode 100. Specifically, fin member 500 has a held portion 510 and an extending portion 520.

Held portion 510 is fit on holding portion 212. Stated another way, held portion 510 is fit to holding portion 212 from the outer circumferential side of holding portion 212.

Extending portion 520 extends downstream from held portion 510 in the flow direction of the processed gas. As shown in FIG. 1, an inner circumferential surface 500S of extending portion 520 is spaced from inner electrode 100.

As shown in FIG. 1, a length L between fin member 500 and tip end 101 of inner electrode 100 is preferably more than or equal to three times and less than or equal to ten times as long as an inner diameter y of insulating member 400, and is more preferably more than or equal to five times and less than or equal to seven times as long as this inner diameter y. This facilitates a blow of the process gas in a fully developed state from nozzle 600. Note that length L refers to the length between tip end 101 of inner electrode 100 and a downstream end of grooves 501 formed in fin member 500.

Nozzle 600 is a portion that blows the swirling flow converted into a plasma state. Nozzle 600 is connected to a tip end portion of outer electrode 300. Insulating member 400 has a tip end portion (downstream end) 402 secured to nozzle 600.

Gas supply unit 700 is a portion for supplying the process gas to the inner side of insulating member 400. Gas supply unit 700 is provided at a position spaced from outer electrode 300 in a direction parallel to the central axis of inner electrode 100.

As shown in FIG. 1, intermediate member 750 is interposed between gas supply unit 700 and outer electrode 300. In other words, gas supply unit 700 is connected to a base end portion of outer electrode 300 with intermediate member 750 therebetween. Intermediate member 750 has an insulating property. Insulating member 400 has a base end portion 401 secured to intermediate member 750.

In plasma processing apparatus 1 described above, when a process gas is supplied from gas supply unit 700, the process gas passes between an inner circumferential surface of intermediate member 750 and the outer circumferential surface of outer holder 210 of electrode holder 200 to flow to the inner side of insulating member 400, and passes between insulating member 400 and flow path forming surface S2 to reach fin member 500. The process gas is then turned into a swirling flow around inner electrode 100 by passing through grooves 501 in fin member 500, converted into a plasma state in the vicinity of tip end 101 of inner electrode 100, and blown from nozzle 600.

As described above, in plasma processing apparatus 1 according to the present embodiment, the swirling flow formed at fin member 500 increases the length of the flow path of the process gas between inner electrode 100 and outer electrode 300, which leads to the generation of stable plasma. Further, since insulating member 400 is directly or indirectly secured to outer electrode 300, and fin member 500 is secured to electrode holder 200 and is in contact with the inner circumferential surface of insulating member 400, misalignment of the central axis of inner electrode 100 with respect to outer electrode 300 is effectively suppressed.

In addition, since inner electrode 100 is held at a plurality of locations including tip end 221 of first inner holder 220 and tip end 231 of second inner holder 230, the misalignment of the central axis of inner electrode 100 with respect to outer electrode 300 is more reliably suppressed.

It will be understood by those skilled in the art that the plurality of exemplary embodiments described above are specific examples of the following aspects.

[Aspect 1] A plasma processing apparatus comprising:

an inner electrode that receives application of a voltage;

an electrode holder that holds the inner electrode;

an outer electrode formed in a tubular shape, the outer electrode surrounding the inner electrode and the electrode holder;

an insulating member arranged between the inner electrode and the outer electrode and between the electrode holder and the outer electrode, the insulating member surrounding the inner electrode and the electrode holder;

a fin member for forming a swirling flow around the inner electrode by causing a process gas supplied to an inner side of the insulating member to swirl; and a nozzle that blows the swirling flow converted into a plasma state, wherein the insulating member is directly or indirectly secured to the outer electrode, and the fin member is secured to the electrode holder while being spaced from the inner electrode, and is in contact with an inner circumferential surface of the insulating member.

In this plasma processing apparatus, since the insulating member is directly or indirectly secured to the outer electrode, and the fin member is secured to the electrode holder while being spaced from the inner electrode, and is in contact with the inner circumferential surface of the insulating member, heat conduction from the inner electrode and the outer electrode to the fin member is suppressed. Thus, damage to and wear of the fin member is suppressed.

[Aspect 2] The plasma processing apparatus according to aspect 1, wherein the electrode holder has a contact surface in contact with the inner circumferential surface of the insulating member, and a flow path forming surface spaced from the inner circumferential surface of the insulating member, the flow path forming surface forming a flow path of the process gas together with the inner circumferential surface of the insulating member.

In this aspect, the position of the electrode holder with respect to the insulating member is effectively determined.

[Aspect 3] The plasma processing apparatus according to aspect 2, wherein the electrode holder has a holding portion that holds the fin member, and the holding portion is formed downstream of the flow path forming surface in a flow direction of the process gas.

[Aspect 4] The plasma processing apparatus according to any one of aspects 1 to 3, further comprising:

a gas supply unit provided at a position spaced from the outer electrode in a direction parallel to a central axis of the inner electrode, the gas supply unit supplying the process gas; and an intermediate member interposed between the gas supply unit and the outer electrode, wherein the insulating member has a base end portion secured to the intermediate member, and the insulating member has a tip end portion secured to the nozzle.

[Aspect 5] The plasma processing apparatus according to any one of aspects 1 to 4, wherein a length between the fin member and a tip end of the inner electrode is more than or equal to five times and less than or equal to twenty times as long as an inner diameter of the insulating member.

Although the embodiments of the present invention have been described, it should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A plasma processing apparatus comprising:
an inner electrode that receives application of a voltage;
an electrode holder that surrounds and holds the inner electrode;
an outer electrode formed in a tubular shape, the outer electrode surrounding the inner electrode and the electrode holder;

6 an insulating member arranged between the inner electrode and the outer electrode and between the electrode holder and the outer electrode, the insulating member surrounding the inner electrode and the electrode holder;

a fin member for forming a swirling flow around the inner electrode by causing a process gas supplied to an inner side of the insulating member to swirl; and a nozzle that blows the swirling flow converted into a plasma state, wherein the insulating member is directly or indirectly secured to the outer electrode, and the fin member is secured to the electrode holder while being spaced from the inner electrode, and is in contact with an inner circumferential surface of the insulating member.

2. The plasma processing apparatus according to claim 1, wherein the electrode holder has a contact surface in contact with the inner circumferential surface of the insulating member, and a flow path forming surface spaced from the inner circumferential surface of the insulating member, the flow path forming surface forming a flow path of the process gas together with the inner circumferential surface of the insulating member.

3. The plasma processing apparatus according to claim 2, wherein the electrode holder has a holding portion that holds the fin member, and the holding portion is formed downstream of the flow path forming surface in a flow direction of the process gas.

4. The plasma processing apparatus according to claim 1, further comprising:

a gas supply unit provided at a position spaced from the outer electrode in a direction parallel to a central axis of the inner electrode, the gas supply unit supplying the process gas; and an intermediate member interposed between the gas supply unit and the outer electrode, wherein the insulating member has a base end portion secured to the intermediate member, and the insulating member has a tip end portion secured to the nozzle.

5. The plasma processing apparatus according to claim 1, wherein a length between the fin member and a tip end of the inner electrode is more than or equal to three times and less than or equal to ten times as long as an inner diameter of the insulating member.

6. The plasma processing apparatus according to claim 1, wherein the fin member has an inner circumferential surface which is spaced from the inner electrode.

* * * * *